United States Patent
Tang et al.

(10) Patent No.: US 10,340,793 B1
(45) Date of Patent: Jul. 2, 2019

(54) DIGITAL CONTROL OF CHARGE PUMP

(71) Applicant: Wuhan Xinxin Semiconductor Manufacturing Co., Ltd., Wuhan, Hubei Province (CN)

(72) Inventors: Yuan Tang, San Jose, CA (US); Jen-Tai Hsu, San Jose, CA (US)

(73) Assignee: Wuhan Xinxin Semiconductor Manufacturing Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/198,855

(22) Filed: Nov. 22, 2018

(51) Int. Cl.
  *H02M 3/07* (2006.01)
  *H03K 19/094* (2006.01)
  *H03K 19/0948* (2006.01)

(52) U.S. Cl.
  CPC .......... *H02M 3/07* (2013.01); *H03K 19/0948* (2013.01)

(58) Field of Classification Search
  CPC .............................. H02M 3/07; H03K 19/0948
  USPC .................................................. 327/534–539
  See application file for complete search history.

(56) References Cited

U.S. PATENT DOCUMENTS

| | | | | |
|---|---|---|---|---|
| 7,821,328 B2 * | 10/2010 | Hoque | ................... | H02M 3/07 323/312 |
| 9,653,126 B2 * | 5/2017 | Nguyen | ................ | G11C 5/145 |
| 9,831,852 B2 * | 11/2017 | Boakye | ............. | H03K 3/02337 |

* cited by examiner

*Primary Examiner* — Dinh T Le
(74) *Attorney, Agent, or Firm* — Winston Hsu

(57) ABSTRACT

A charge pump system includes: a differential amplifier, for receiving a feedback voltage and a reference voltage and generating an output signal; an oscillating circuit for generating clock pulses; a charge pump for receiving the clock pulses and generating an output voltage; a current sink coupled to the output of the charge pump; a first pair of cascode transistors for generating a digital signal; and an inverter for inverting the digital signal to generate a first digital signal according to the output signal, wherein the first digital signal is input to the current sink. When the feedback voltage is higher than the reference voltage, the first digital signal will be generated and the current sink will be turned on, and when the feedback voltage is lower than the reference voltage, the first digital signal will not be generated and the current sink will be turned off.

9 Claims, 2 Drawing Sheets

DIGITAL CONTROL OF CHARGE PUMP

BACKGROUND OF THE INVENTION

1. Field of the Invention

The present invention relates to charge pumps, and more particularly, to charge pump regulation using digital control signals.

2. Description of the Prior Art

Conventional charge pumps generate an output voltage according to a clock input to ramp up a voltage. The output of the charge pump is also fed back to a differential amplifier, which compares the pump output with a reference voltage to generate a comparison signal. When the output is less than the reference voltage, the rate of the clock cycles will be increased to pump the charge pump higher. When the output is greater than the reference voltage, the rate of the clock cycles will be decreased or the clock will be stopped to discharge the pump.

The voltage control of the clock is therefore analog control. If digital control signals could be generated, a system could achieve greater or even full-chip control of the charge pump system.

SUMMARY OF THE INVENTION

This in mind, the invention provides a method and circuitry for generating digital control signals to control a charge pump.

A charge pump system according to an exemplary embodiment of the present invention comprising: a differential amplifier, for receiving a feedback voltage and a reference voltage, and generating an output signal according to a difference between the feedback voltage and the reference voltage; an oscillating circuit for generating clock pulses at a rate according to the output signal; a charge pump for receiving the clock pulses and generating an output voltage which is input to the differential amplifier as the feedback voltage; a current sink comprising an NMOS having a source coupled to the output of the charge pump and a drain coupled to ground; a first pair of cascode transistors coupled between a voltage supply and ground for generating a digital signal; and an inverter for inverting the digital signal to generate a first digital signal according to the output signal, wherein the first digital signal is input to a gate of the current sink; wherein when the feedback voltage is higher than the reference voltage, the first digital signal will be generated and the current sink will be turned on, and when the feedback voltage is lower than the reference voltage, the first digital signal will not be generated and the current sink will be turned off. The first pair of cascode transistors comprises a PMOS having a source coupled to the voltage supply and a gate coupled to the output signal from the differential amplifier; and an NMOS having a source coupled to a drain of the PMOS, a drain coupled to ground, and a gate coupled to a constant bias. The inverter is coupled to the drain of the PMOS.

The charge pump system further comprises a second pair of cascode transistors coupled in series between the power supply and ground, comprising: a PMOS having a gate coupled to the output signal from the differential amplifier and a source coupled to the power supply; and an NMOS having a source coupled to a drain of the PMOS, a drain coupled to ground, and a gate coupled to the source; wherein the drain of the PMOS generates an analog signal according to the output signal and inputs the analog signal to the oscillating circuit.

The charge pump system further comprises a voltage divider coupled to the output of the charge pump, for generating a divided voltage according to the output of the charge pump, and inputting the divided voltage to the differential amplifier as the feedback voltage.

The charge pump system further comprises: a current source, comprising a transistor, having a source coupled to the output of the differential amplifier, a drain coupled to ground, and a gate for receiving the constant bias; and a third pair of cascode transistors coupled between the power supply and ground, for generating the constant bias to the current source and the NMOS of the first pair of cascode transistors.

The charge pump system further comprises: a pulse generator for receiving the first digital signal and generating digital pulses; and a latch, for receiving the digital pulses and latching a second digital signal to a high logic level according to a first rising edge of the digital pulses, the second digital signal indicating that the charge pump has been charged to a first predetermined level. When the latch receives a reset signal, the second digital signal will return to a low logic level.

A method for generating digital control signals according to an exemplary embodiment of the present invention comprises: receiving a feedback voltage and a reference voltage, and generating an output signal according to a difference between the feedback voltage and the reference voltage; generating clock pulses at a rate according to the output signal; receiving the clock pulses at a charge pump and generating an output voltage; utilizing the output voltage as the feedback voltage; utilizing a first pair of cascode transistors to generate a digital signal according to the output signal; and inverting the digital signal to generate a first digital signal, and inputting the first digital signal to a current sink which is connected to the charge pump. The first pair of cascode transistors comprises: a PMOS coupled to the output signal; and an NMOS coupled to a constant bias. When the feedback voltage is higher than the reference voltage, the first digital signal will be generated and the current sink will be turned on, and when the feedback voltage is lower than the reference voltage, the first digital signal will not be generated and the current sink will be turned off.

The step of generating clock pulses at a rate according to the output signal comprises: utilizing a second pair of cascode transistors to generate an analog signal according to the output signal. The clock pulses are generated according to the analog signal.

The step of utilizing the output voltage as the feedback voltage comprises: generating a divided voltage according to the output voltage, and utilizing the divided voltage as the feedback voltage.

The method further comprises: generating digital pulses according to the first digital signal; latching a second digital signal to a high logic level according to a first rising edge of the digital pulses, the second digital signal indicating that the charge pump has been charged to a first predetermined level; and receiving a reset signal for resetting the second digital signal to a low logic level.

These and other objectives of the present invention will no doubt become obvious to those of ordinary skill in the art after reading the following detailed description of the preferred embodiment that is illustrated in the various figures and drawings.

DETAILED DESCRIPTION

The present invention provides digital control signals which can be generated by existing differential amplifier circuitry. The aim is to provide turn-off control for a sink current. If the pump can be controlled to sink more current then the output of the pump will go lower, which thereby provides faster output control than merely controlling the clock rate. Further, if the current sink can be turned off, the pump will charge faster, thereby saving energy and power.

Figure 1:
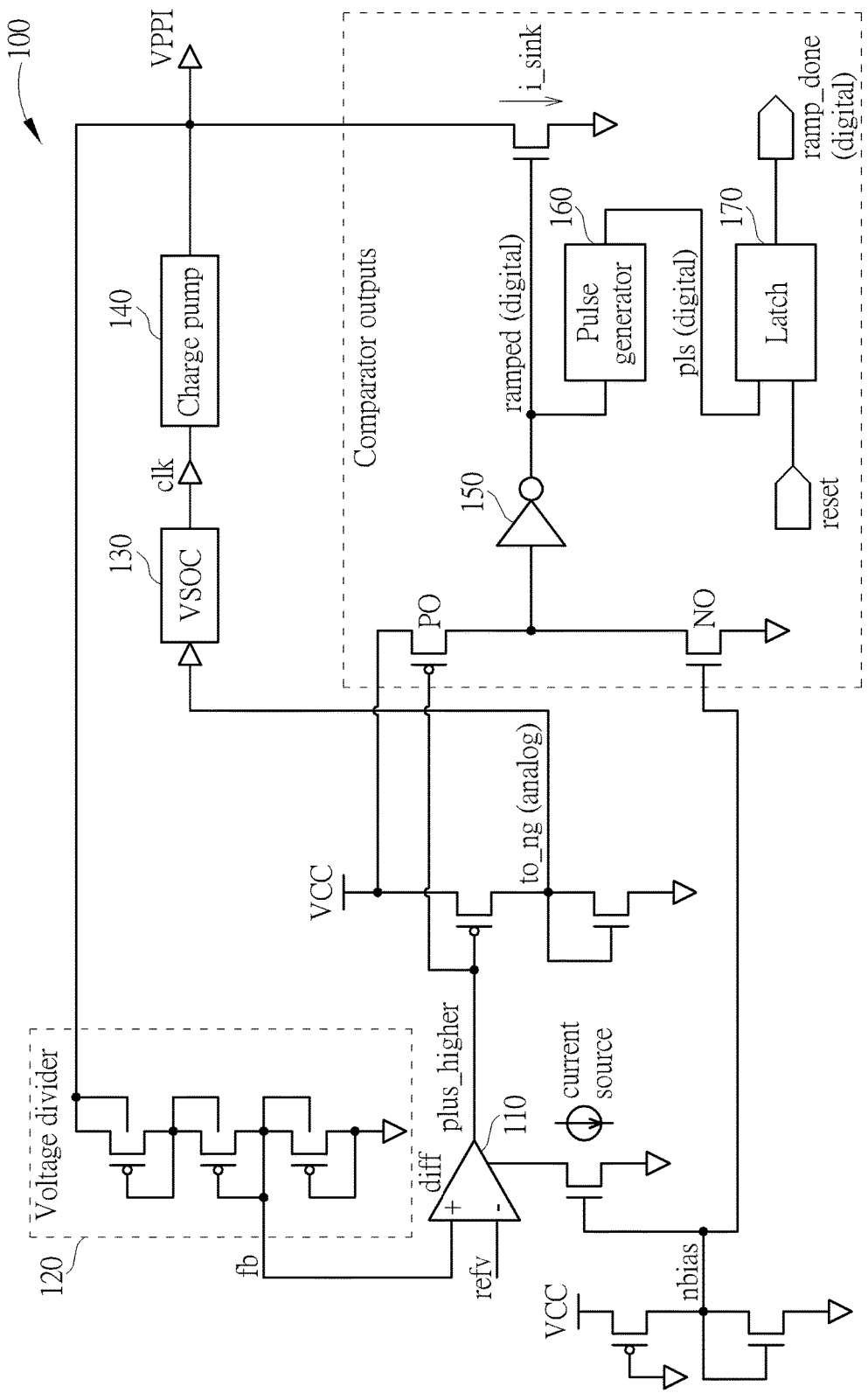
FIG. 1 is a diagram of a charge pump system according to an exemplary embodiment of the present invention.

Refer to FIG. 1, which is a diagram of a charge pump system 100 according to an exemplary embodiment of the present invention. The charge pump system 100 comprises a differential amplifier 110, having a positive input coupled to a feedback voltage (fb) and a negative input coupled to a reference voltage (refv). The output of the differential amplifier 110 is a signal plus_higher which is input to a P-type transistor coupled between a power supply VCC and an N-type transistor coupled to ground. The output of the differential amplifier 110 is further coupled to a current source comprising a transistor which has its gate biased by two cascode transistors coupled between VCC and ground.

The P-type transistor which receives the signal plus_higher generates an analog signal to_ng at its drain. The plus_higher signal is equivalent to the output of the charge pump 140. When this signal goes high, the P channel will be less conductive. The N channel is equivalent to a diode, wherein when the resistance goes higher the analog signal to_ng goes lower. This signal is input to an oscillating circuit 130 (VSOC) which generates clock pulses at a rate according to the analog signal to_ng. The clock pulses are input to the charge pump 140, which generates an output voltage VPPI according to the rate of the clock pulses. The output voltage VPPI is fed back to the differential amplifier via a voltage divider 120.

As well as the standard analog control of the charge pump system 100, the invention provides a comparator circuit for generating digital control signals. The output of the differential amplifier 110 plus_higher is also input to the gate of transistor P0, which has a drain coupled to VCC and a source coupled to an N-type transistor N0, and a logic gate 150, which is a Not gate (inverter). The gate of N0 is biased by the signal nbias generated by the cascode transistors. N0 will therefore be fixed, while P0 has high impedance. A small change in resistance will cause a large change in P0: therefore, the output becomes a digital signal.

The inverter 150 works to generate a digital signal in response to its input from P0. Please note that this digital signal will be generated in accordance with the output from the differential amplifier 110. As detailed in the background, an analog signal will be generated when the charge pump 140 has an output VPPI which is less than the reference voltage. This means that the output of the inverter 150 will be logic '0'. When the output VPPI is greater than the reference voltage, the analog signal to_ng will not be generated, meaning the output of the inverter 150 will be logic '1'. In other words, the inverter 150 generates a digital signal 'ramped' only when VPPI is greater than the reference voltage.

The digital signal 'ramped' is coupled to a gate of a current sink transistor, having a source coupled to the output of the charge pump 140, and a drain coupled to ground. The digital signal 'ramped' is also coupled to a pulse generator 160, which generates a digital pulse 'pls' according to the output of the inverter 150. The digital pulse is input to a latch 170, which receives a reset signal as another input and generates a 'ramp_done' signal.

The ramped signal will turn on the current sink when the output of the charge pump 140 is greater than the reference voltage, i.e. when the differential amplifier 110 does not generate the signal plus_higher. Turning on the current sink can quickly lower the pump output more efficiently than by only changing the clock rate of the clock input to the charge pump 140. Similarly, when the output of the charge pump 140 is less than the reference voltage, i.e. when the differential amplifier 110 generates the signal plus_higher, the ramped signal will not be generated so the current sink will be turned off, and no current will be sunk from the pump output, thereby saving power and pump strength.

The ramped signal is also latched by the latch 170 to generate the signal ramp_done, which is generated when the pump is ramped to a limit or to a regulated point. By generating ramp_done, the whole system can be informed of the result.

Figure 2A:
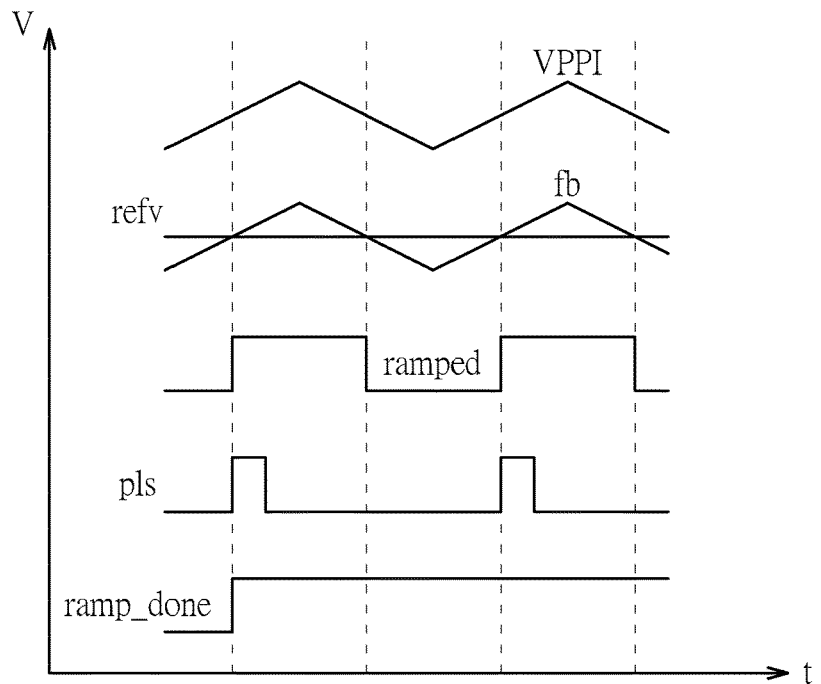
FIG. 2A is a graph showing a variation in voltage of various signals shown in FIG. 1 over time.
Figure 2B:
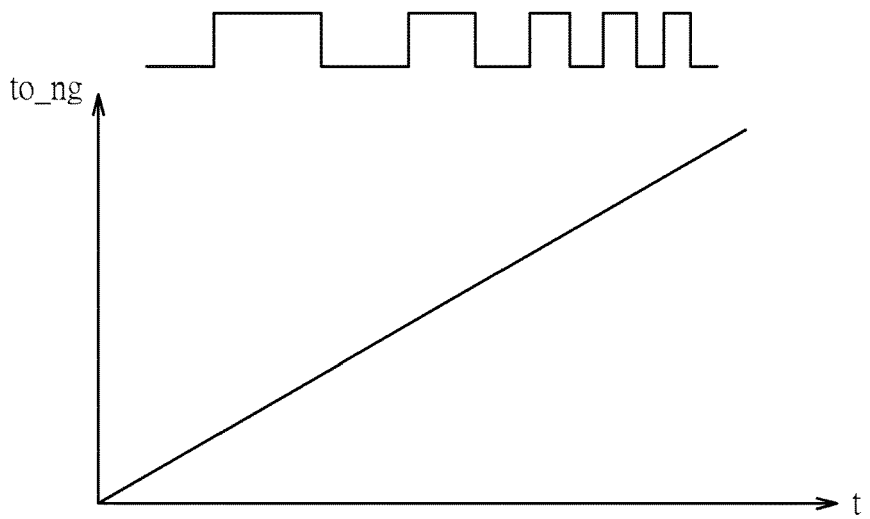
FIG. 2B is a graph illustrating the relationship between clock pulses for controlling the charge pump and an analog control signal.

Refer to FIG. 2A which shows how various signals shown in FIG. 1 vary in voltage over time. The signals shown are VPPI (the charge pump output), the reference voltage refv, the feedback voltage fb, the digital signal ramped, the digital pulse pls generated by the pulse generator, and the digital signal ramp_done. As shown in the diagram, ramped is a unit signal going from zero to high. The pulse pls is a waveform pulse, having a rising edge corresponding to the rising edge of 'ramped'. In other words, when 'ramped' goes high, the pulse pls goes high. While the ramped signal remains high, however, the pulse pls will fall back down. The first rising edge of the pulse pls latches the latch 170 so that ramp_done always remains high, until reset by the reset signal (not shown in FIG. 2A). The use of the latch 170 controlled by the digital pulse means that 'ramped' and ramp_done will not go low at the same time.

As shown by the above, the signal 'ramped' can control both the current sink and the latch for generating the signal 'ramp_done'. Ramp_done can inform the charge pump system 100 that pump ramping is completed, i.e. the pump output has reached a regulation level. The ramp_done signal is very useful for entire circuit/system control. For example, when programming a memory cell, it must be guaranteed that the pump is charged enough, and has reached a stable regulated level. In another example, when the pump must provide lots of charge, a clock rate can be used to make it go to regulation level. As soon as signal ramp_done is generated, the pump can be slowed down.

The invention therefore provides digital control signals which can efficiently control a charge pump system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump system, for generating digital control signals according to an output of a charge pump, the charge pump system comprising:
   a differential amplifier, for receiving a feedback voltage and a reference voltage, and generating an output signal according to a difference between the feedback voltage and the reference voltage;
   an oscillating circuit for generating clock pulses at a rate according to the output signal;
   a charge pump for receiving the clock pulses and generating an output voltage which is input to the differential amplifier as the feedback voltage;
   a current sink comprising an NMOS having a source coupled to the output of the charge pump and a drain coupled to ground;
   a first pair of cascode transistors coupled between a voltage supply and ground for generating a digital signal, comprising:
      a PMOS having a source coupled to the voltage supply and a gate coupled to the output signal from the differential amplifier; and
      an NMOS having a source coupled to a drain of the PMOS, a drain coupled to ground, and a gate coupled to a constant bias; and
   an inverter coupled to the drain of the PMOS, for inverting the digital signal to generate a first digital signal according to the output signal, wherein the first digital signal is input to a gate of the current sink;
   wherein when the feedback voltage is higher than the reference voltage, the first digital signal will be generated and the current sink will be turned on, and when the feedback voltage is lower than the reference voltage, the first digital signal will not be generated and the current sink will be turned off.

2. The charge pump system of claim 1, further comprising a second pair of cascode transistors coupled in series between the power supply and ground, comprising:
   a PMOS having a gate coupled to the output signal from the differential amplifier and a source coupled to the power supply; and
   an NMOS having a source coupled to a drain of the PMOS, a drain coupled to ground, and a gate coupled to the source;
   wherein the drain of the PMOS generates an analog signal according to the output signal and inputs the analog signal to the oscillating circuit.

3. The charge pump system of claim 1, further comprising a voltage divider coupled to the output of the charge pump, for generating a divided voltage according to the output of the charge pump, and inputting the divided voltage to the differential amplifier as the feedback voltage.

4. The charge pump system of claim 1, further comprising:
   a current source, comprising a transistor, having a source coupled to the output of the differential amplifier, a drain coupled to ground, and a gate for receiving the constant bias; and
   a third pair of cascode transistors coupled between the power supply and ground, for generating the constant bias to the current source and the NMOS of the first pair of cascode transistors.

5. The charge pump system of claim 1, further comprising:
   a pulse generator for receiving the first digital signal and generating digital pulses; and
   a latch, for receiving the digital pulses and latching a second digital signal to a high logic level according to a first rising edge of the digital pulses, the second digital signal indicating that the charge pump has been charged to a first predetermined level;
   wherein when the latch receives a reset signal, the second digital signal will return to a low logic level.

6. A method for generating digital control signals according to an output of a charge pump, the method comprising:
   receiving a feedback voltage and a reference voltage, and generating an output signal according to a difference between the feedback voltage and the reference voltage;
   generating clock pulses at a rate according to the output signal;
   receiving the clock pulses at a charge pump and generating an output voltage;
   utilizing the output voltage as the feedback voltage;
   utilizing a first pair of cascode transistors to generate a digital signal according to the output signal, the first pair of cascode transistors comprising:
      a PMOS coupled to the output signal; and
      an NMOS coupled to a constant bias; and
   inverting the digital signal to generate a first digital signal, and inputting the first digital signal to a current sink which is connected to the charge pump;
   wherein when the feedback voltage is higher than the reference voltage, the first digital signal will be generated and the current sink will be turned on, and when the feedback voltage is lower than the reference voltage, the first digital signal will not be generated and the current sink will be turned off.

7. The method of claim 6, wherein the step of generating clock pulses at a rate according to the output signal comprises:
   utilizing a second pair of cascode transistors to generate an analog signal according to the output signal;
   wherein the clock pulses are generated according to the analog signal.

8. The method of claim 6, wherein the step of utilizing the output voltage as the feedback voltage comprises:
   generating a divided voltage according to the output voltage, and utilizing the divided voltage as the feedback voltage.

9. The method of claim 6, further comprising:
   generating digital pulses according to the first digital signal;
   latching a second digital signal to a high logic level according to a first rising edge of the digital pulses, the second digital signal indicating that the charge pump has been charged to a first predetermined level; and
   receiving a reset signal for resetting the second digital signal to a low logic level.

* * * * *